US010042963B2

(12) United States Patent
Petroski et al.

(10) Patent No.: US 10,042,963 B2
(45) Date of Patent: Aug. 7, 2018

(54) SYSTEMS AND METHODS FOR SOLAR POWER EQUIPMENT

(71) Applicant: Alpha Technologies Inc., Bellingham, WA (US)

(72) Inventors: Gordon H. Petroski, North Delta (CA); John R. Meyer, Bellingham, WA (US)

(73) Assignee: Alpha Technologies Inc., Bellingham, WA (US)

( * ) Notice: Subject to any disclaimer, the term of this patent is extended or adjusted under 35 U.S.C. 154(b) by 389 days.

(21) Appl. No.: 14/716,686

(22) Filed: May 19, 2015

(65) Prior Publication Data
US 2015/0254381 A1    Sep. 10, 2015

Related U.S. Application Data

(63) Continuation of application No. 13/653,359, filed on Oct. 16, 2012, now Pat. No. 9,037,443.
(Continued)

(51) Int. Cl.
*G06F 17/50* (2006.01)
*F03G 6/00* (2006.01)
*H01L 31/046* (2014.01)

(52) U.S. Cl.
CPC ......... *G06F 17/5009* (2013.01); *F03G 6/001* (2013.01); *H01L 31/046* (2014.12); *Y02E 10/46* (2013.01)

(58) Field of Classification Search
CPC ....... A01G 25/165; G06F 1/3206; B60L 3/12; F03G 6/067; G06Q 30/20
See application file for complete search history.

(56) References Cited

U.S. PATENT DOCUMENTS 3,944,837 A    3/1976   Meyers et al.
4,063,963 A   12/1977   Bond, Jr.
(Continued)

FOREIGN PATENT DOCUMENTS

AU    9520294    12/1995
CA    1265231     1/1990
(Continued)

OTHER PUBLICATIONS

Boehringer, "Self-adapting dc Converter for Solar Spacecraft Power Supply," IEEE Transactions on Aerospace and Electronic Systems, vol. AES-4, No. 1, Jan. 1968, pp. 102-111.
(Continued)

*Primary Examiner* — Kandasamy Thangavelu
(74) *Attorney, Agent, or Firm* — Michael R. Schacht; Schacht Law Office, Inc.

(57) ABSTRACT

Power equipment designed for use at a particular location comprises an insolation database, a load database, a processing system, and solar power equipment. The insolation database comprises insolation values associated with a plurality of geographic data points. The load database associates appropriate power equipment with load requirements. The processing system determines a solar power design from load requirements generated from the insolation database based on the insolation values associated with a geographic data point closest to the particular location and the load requirements selected from the load database. The solar power equipment is installed according to the solar power design.

15 Claims, 15 Drawing Sheets

Related U.S. Application Data

(60) Provisional application No. 61/547,727, filed on Oct. 16, 2011.

(56) References Cited

U.S. PATENT DOCUMENTS

| | | | |
|---|---|---|---|
| 4,262,209 A | 4/1981 | Berner | |
| 4,731,547 A | 3/1988 | Alenduff et al. | |
| 4,943,763 A | 7/1990 | Bobry | |
| 4,975,649 A | 12/1990 | Bobry | |
| 5,010,469 A | 4/1991 | Bobry | |
| 5,029,285 A | 7/1991 | Bobry | |
| 5,228,924 A | 7/1993 | Barker et al. | |
| 5,302,858 A | 4/1994 | Folts | |
| 5,400,005 A | 3/1995 | Bobry | |
| 5,410,720 A | 4/1995 | Osterman | |
| 5,457,377 A | 10/1995 | Jonsson | |
| 5,532,525 A | 7/1996 | Kaiser et al. | |
| 5,638,244 A | 6/1997 | Mekanik et al. | |
| 5,642,002 A | 6/1997 | Mekanik et al. | |
| 5,739,595 A | 4/1998 | Mekanik et al. | |
| 5,760,495 A | 6/1998 | Mekanik | |
| 5,856,712 A | 1/1999 | Suzuki et al. | |
| 5,892,431 A | 4/1999 | Osterman | |
| 5,949,662 A | 9/1999 | Boldin et al. | |
| 5,961,604 A | 10/1999 | Anderson et al. | |
| 5,982,645 A | 11/1999 | Levran et al. | |
| 5,994,793 A | 11/1999 | Bobry | |
| 6,014,015 A | 1/2000 | Thorne et al. | |
| 6,093,885 A | 7/2000 | Takehara et al. | |
| 6,198,177 B1 | 3/2001 | Mao et al. | |
| 6,201,371 B1 | 3/2001 | Kawabe et al. | |
| 6,288,916 B1 | 9/2001 | Liu et al. | |
| 6,348,782 B1 | 2/2002 | Oughton, Jr. et al. | |
| 6,483,730 B2 | 11/2002 | Johnson, Jr. | |
| 6,486,399 B1 | 11/2002 | Armstrong et al. | |
| 6,542,791 B1 | 4/2003 | Perez | |
| 6,602,627 B2 | 8/2003 | Liu et al. | |
| 6,605,879 B2 | 8/2003 | Wade et al. | |
| 6,841,971 B1 | 1/2005 | Spee et al. | |
| 6,933,626 B2 | 8/2005 | Oughton, Jr. | |
| 7,040,920 B2 | 5/2006 | Johnson, Jr. et al. | |
| 7,050,312 B2 | 5/2006 | Tracy et al. | |
| 7,182,632 B1 | 2/2007 | Johnson, Jr. et al. | |
| 7,449,798 B2 | 11/2008 | Suzuki et al. | |
| 7,567,520 B2 | 7/2009 | Ostrosky | |
| 7,746,669 B2 | 6/2010 | Falk | |
| 7,800,922 B2 | 9/2010 | Takayanagi et al. | |
| RE43,572 E | 8/2012 | West | |
| 8,575,779 B2 | 11/2013 | Le et al. | |
| 9,037,443 B1 | 5/2015 | Meyer et al. | |
| 9,087,338 B2 * | 7/2015 | Levine | G06Q 30/02 |
| 9,348,394 B2 * | 5/2016 | Harper, III | G06F 1/3206 |
| 2003/0038610 A1 | 2/2003 | Munshi et al. | |
| 2003/0047209 A1 | 3/2003 | Yanai et al. | |
| 2003/0117822 A1 | 6/2003 | Stamenic et al. | |
| 2007/0159858 A1 | 7/2007 | Spindler et al. | |
| 2007/0194759 A1 | 8/2007 | Shimizu et al. | |
| 2007/0199336 A1 | 8/2007 | Tantot | |
| 2008/0197122 A1 | 8/2008 | Gober | |
| 2009/0194145 A1 | 8/2009 | Kribus et al. | |
| 2010/0017045 A1 | 1/2010 | Nesler et al. | |
| 2010/0109601 A1 | 5/2010 | Coyle et al. | |
| 2010/0169008 A1 * | 7/2010 | Niwa | B60L 3/12 701/532 |
| 2010/0279455 A1 | 11/2010 | Seemann | |
| 2010/0318297 A1 | 12/2010 | Herzig et al. | |
| 2011/0068624 A1 | 3/2011 | Dibachi et al. | |
| 2011/0087379 A1 * | 4/2011 | Savelle, Jr. | A01G 25/165 700/284 |
| 2011/0100004 A1 | 5/2011 | Al-Mazeedi | |
| 2011/0114079 A1 | 5/2011 | Heckendorn | |
| 2011/0198932 A1 | 8/2011 | Le et al. | |
| 2011/0204720 A1 | 8/2011 | Ruiz et al. | |
| 2011/0291608 A1 | 12/2011 | Shimura et al. | |
| 2012/0158362 A1 | 6/2012 | Vandevelde et al. | |
| 2012/0188806 A1 | 7/2012 | Tamura et al. | |
| 2013/0056170 A1 * | 3/2013 | Klemencic | F03G 6/067 165/10 |
| 2013/0081396 A1 | 4/2013 | Kuo | |
| 2014/0062189 A1 | 3/2014 | Le et al. | |

FOREIGN PATENT DOCUMENTS

| | | |
|---|---|---|
| CA | 2033685 | 10/1991 |
| CA | 2036296 | 11/1991 |
| CA | 1297546 | 3/1992 |
| CA | 2086897 | 7/1993 |
| CA | 2028269 | 1/2000 |
| CA | 2149845 | 2/2000 |
| CA | 2168520 | 4/2003 |
| CA | 2403888 | 5/2007 |
| CA | 2713017 | 7/2009 |
| CA | 2504101 | 5/2010 |
| DE | 93027567 | 5/1993 |
| EP | 0827254 | 11/2005 |
| GB | 2355350 | 4/2001 |
| JP | 61165051 | 10/1986 |
| JP | 2000023365 | 1/2000 |
| JP | 2001190035 | 7/2001 |
| JP | 2004296547 | 10/2004 |
| JP | 3142899 | 6/2008 |
| KR | 2019990000402 | 1/1999 |
| KR | 1020070004478 | 1/2007 |
| KR | 1020070078524 | 8/2007 |
| WO | 2007129808 | 11/2007 |
| WO | 2009094540 A2 | 7/2009 |
| WO | 2011103131 | 8/2011 |
| ZA | 0931273 | 2/1993 |

OTHER PUBLICATIONS

Enslin, "Maximum Power Point Tracking: A Cost Saving Necessity in Solar Energy Systems" Renewable Energy vol. 2, No. 6, 1992, pp. 543-549.
Enslin, Wolf, Snyman, Swiegers, "Integrated Photovoltaic Maximum Power Point Tracking Converter", IEEE Transactions on Industrial Electronics, vol. 44, No. 6, Dec. 1997, pp. 769-773.
PCT International Search Report, International Application No. PCT/US2009/031836, dated Aug. 18, 2009, 12 pages.
PCT International Search Report, International Application No. PCT/US2010/032832, dated Dec. 2, 2010, 10 pages.
PCT International Search Report, International Application No. PCT/US2011/056597, dated Jan. 11, 2012, 12 pages.
Schoeman, Van Wyk, "A Simplified Maximal Power Controller for Terrestrial Photovoltaic Panel Arrays", 13th Annual IEEE Power Electronics Specialists Conference (PESC '82 Record), Jun. 1982, pp. 361-367, Cambridge, MA.
Snyman, Enslin, "An Experimental Evaluation of MPPT Converter Topologies for PV Installations", Renewable Energy, vol. 3, No. 8, 1993, pp. 841-848.
USPTO, "Notice of Allowability, U.S. Appl. No. 14/710,421", dated Jun. 23, 2017, 5 pages.

* cited by examiner

STEP 2:
DEFINE LOAD

INSTRUCTIONS: Please specify your load. Enter a short description, quantity, power consumed, and the hours per day that the sub-load will operated. You may also add other sub-loads to help keep the load organized. Don't forget to select the appropriate system voltage from the drop-down box.

| Description | Quantity | Watts | Hours/Day | Wh/Day |  |
|---|---|---|---|---|---|
| Camera | 2 | 10 | 24 | 480 Wh | ADD — 242 |
| 230a | 232a | 234a | 236a | 238a | |

Total Daily Power Consumption
250 — 480 Wh

System Voltage*
240 — 12V DC

Maximum Hourly Power Consumption
252 — 20 W

System Load
256 — 20 W

Average Power Consumption
254 — 20 W

258 — NEXT

*Please contact Supplier if you require multiple output voltages

STEP 2:
DEFINE LOAD

INSTRUCTIONS: Please specify your load. Enter a short description, quantity, power consumed, and the hours per day that the sub-load will operated. You may also add other sub-loads to help keep the load organized. Don't forget to select the appropriate system voltage from the drop-down box.

| Description 230a | Quantity 232a | Watts 234a | Hours/Day 236a | Wh/Day 238a | 242 |
|---|---|---|---|---|---|
| Camera | 2 | 10 | 24 | 480 Wh | ADD |
| Description | Quantity | Watts 236b | Hours/Day | Wh/Day | |
| Lights | 2 | 50 | 12 | 1200 Wh — 238b | |
| 230b | 232b | 234b | | | |

Total Daily Power Consumption
250 — 1680 Wh

System Voltage*
240 — 12V DC

Maximum Hourly Power Consumption
252 — 120 W

System Load
254 — 120 W

Average Power Consumption
120 W

256

258 — NEXT

*Please contact Supplier if you require multiple output voltages

FIG. 4B

STEP 3:
SELECT SOLUTION

INSTRUCTIONS: Please select an OPS that fulfills your requirements. Simply click on the solution you would like pricing for and continue to Step 4. Hover your mouse over any term you are not familiar with to learn more about it. — 260

LOCATION OVERVIEW: — 270
NEAREST CITY: Bowdon, ND
AVERAGE INSOLATION: 2.17 — 272
MINIMUM INSOLATION: 1.73 — 274

— 262

Premium
System 12-390/800 — 280a
Days of Autonomy: 282a — 24 day(s)
Voltage: 284a — 12 V DC
PV Array Size: 286a — 390 W
Battery Bank Size: 288a — 1680 Wh
PWM or MPPT 290a — MPPT
Warranty 292a — 5 year 264
Standard
System 12-320/530M
280b ↗ 282b
Days of Autonomy: 13 day(s)
Voltage: 284b — 12 V DC
286b
PV Array Size: 288b — 320 W
Battery Bank Size: 530 Ah
PWM or MPPT 290b — MPPT
Warranty 292b — 2 year 266
Economy
System 12160/158 282c
280c
Days of Autonomy: 7 day(s)
Voltage: 284c — 12 V DC
286c
PV Array Size: 288c — 160 W
Battery Bank Size: 156 Ah
PWM or MPPT 290c — PWM
Warranty 292c — 1 year Please select a solution.

268 — NEXT

System Specifications

| | SPS Model Number | Type | Voltage | PV Watts | Ah |
|---|---|---|---|---|---|
| Premium | SPS12-55/106 | PWM | 12 | 55 | 106 |
| | SPS12-110/212 | PWM | 12 | 110 | 212 |
| | SPS12-165/318 | PWM | 12 | 165 | 318 |
| | SPS12-240/530 | PWM | 12 | 240 | 530 |
| | SPS12-320/600M | MPPT | 12 | 320 | 600 |
| | SPS12-390/795M | MPPT | 12 | 390 | 795 |
| | SPS12-480/1060M | MPPT | 12 | 480 | 1060 |
| | SPS24-165/212 | PWM | 24 | 165 | 212 |
| | SPS24-330/400 | PWM | 24 | 330 | 400 |
| | SPS24-495/530 | PWM | 24 | 495 | 530 |
| | SPS24-660/795M | MPPT | 24 | 660 | 795 |
| | SPS24-990/1060M | MPPT | 24 | 990 | 1060 |
| | SPS24-1320/1325M | MPPT | 24 | 1320 | 1325 |
| | SPS48-220/170M | MPPT | 48 | 220 | 170 |
| | SPS48-330/200M | MPPT | 48 | 330 | 200 |
| | SPS48-660/400M | MPPT | 48 | 660 | 400 |
| | SPS48-990/600M | MPPT | 48 | 990 | 600 |
| | SPS48-1320/795M | MPPT | 48 | 1320 | 795 |
| | SPS48-1650/1060M | MPPT | 48 | 1650 | 1060 |
| | SPS48-1980/1325M | MPPT | 48 | 1980 | 1325 |

| | SPS Model Number | Type | Voltage | PV Watts | Ah |
|---|---|---|---|---|---|
| Standard | SPS12-55/78 | PWM | 12 | 55 | 78 |
| | SPS12-110/156 | PWM | 12 | 110 | 158 |
| | SPS12-165/212 | PWM | 12 | 165 | 212 |
| | SPS12-240/318 | PWM | 12 | 240 | 318 |
| | SPS12-320/530M | MPPT | 12 | 320 | 530 |
| | SPS12-390/600M | MPPT | 12 | 390 | 600 |
| | SPS12-480/800M | MPPT | 12 | 480 | 800 |
| | SPS24-165/106 | PWM | 24 | 165 | 106 |
| | SPS24-330/265 | PWM | 24 | 330 | 265 |
| | SPS24-495/400 | PWM | 24 | 495 | 400 |
| | SPS24-660/530M | MPPT | 24 | 660 | 530 |

| Continuous Supportable Load (in A) | | | | | |
|---|---|---|---|---|---|
| 1 | 1.5 | 2 | 2.5 | 3 | 3.5 |
| 0.1 | 0.13 | 0.18 | 0.22 | 0.29 | 0.32 |
| 0.19 | 0.26 | 0.35 | 0.44 | 0.59 | 0.63 |
| 0.29 | 0.39 | 0.53 | 0.66 | 0.88 | 0.95 |
| 0.44 | 0.64 | 0.88 | 1.1 | 1.33 | 1.56 |
| 0.55 | 0.73 | 1 | 1.25 | 1.67 | 1.79 |
| 0.73 | 0.97 | 1.33 | 1.67 | 2.22 | 2.38 |
| 0.97 | 1.29 | 1.77 | 2.21 | 2.94 | 3.15 |
| 0.15 | 0.23 | 0.31 | 0.38 | 0.46 | 0.53 |
| 0.31 | 0.46 | 0.61 | 0.76 | 0.92 | 1.07 |
| 0.46 | 0.64 | 0.88 | 1.1 | 1.38 | 1.58 |
| 0.71 | 0.97 | 1.33 | 1.67 | 2.12 | 2.38 |
| 0.97 | 1.29 | 1.77 | 2.21 | 2.94 | 3.15 |
| 1.21 | 1.61 | 2.21 | 2.76 | 3.68 | 3.94 |
| 0.12 | 0.18 | 0.24 | 0.29 | 0.35 | 0.41 |
| 0.18 | 0.24 | 0.33 | 0.42 | 0.53 | 0.6 |
| 0.35 | 0.49 | 0.67 | 0.83 | 1.06 | 1.19 |
| 0.53 | 0.73 | 1 | 1.25 | 1.59 | 1.79 |
| 0.71 | 0.97 | 1.33 | 1.66 | 2.12 | 2.37 |
| 0.88 | 1.29 | 1.77 | 2.21 | 2.65 | 3.09 |
| 1.06 | 1.59 | 2.12 | 2.65 | 3.18 | 3.71 |
| 1 | 1.5 | 2 | 2.5 | 3 | 3.5 |
| 0.1 | 0.15 | 0.2 | 0.24 | 0.33 | 0.36 |
| 0.21 | 0.3 | 0.4 | 0.49 | 0.65 | 0.72 |
| 0.28 | 0.41 | 0.54 | 0.66 | 0.88 | 0.98 |
| 0.42 | 0.62 | 0.82 | 0.99 | 1.33 | 1.47 |
| 0.7 | 1.03 | 1.36 | 1.66 | 2.21 | 2.45 |
| 0.8 | 1.17 | 1.54 | 1.88 | 2.5 | 2.78 |
| 1.06 | 1.56 | 2.05 | 2.5 | 3.33 | 3.7 |
| 0.14 | 0.21 | 0.27 | 0.33 | 0.44 | 0.49 |
| 0.33 | 0.5 | 0.67 | 0.83 | 1 | 1.17 |
| 0.5 | 0.75 | 1 | 1.25 | 1.5 | 1.75 |
| 0.7 | 1.03 | 1.36 | 1.66 | 2.21 | 2.45 |

| nps) by Insolation Value | | | | |
|---|---|---|---|---|
| 4 | 4.5 | 5 | 5.5 | 6 |
| 0.37 | 0.4 | 0.44 | 0.49 | 0.55 |
| 0.74 | 0.8 | 0.88 | 0.98 | 1.1 |
| 1.1 | 1.2 | 1.33 | 1.47 | 1.66 |
| 1.78 | 2 | 2.21 | 2.44 | 2.67 |
| 2.08 | 2.27 | 2.5 | 2.78 | 3.13 |
| 2.78 | 3.03 | 3.33 | 3.7 | 4.17 |
| 3.68 | 4.02 | 4.42 | 4.91 | 5.52 |
| 0.61 | 0.69 | 0.76 | 0.84 | 0.92 |
| 1.22 | 1.38 | 1.53 | 1.68 | 1.83 |
| 1.83 | 2.01 | 2.21 | 2.45 | 2.75 |
| 2.78 | 3.03 | 3.33 | 3.7 | 4.17 |
| 3.68 | 4.02 | 4.42 | 4.91 | 5.52 |
| 4.6 | 5.02 | 5.52 | 6.13 | 6.9 |
| 0.47 | 0.53 | 0.59 | 0.65 | 0.71 |
| 0.69 | 0.76 | 0.83 | 0.93 | 1.04 |
| 1.39 | 1.52 | 1.67 | 1.85 | 2.08 |
| 2.08 | 2.27 | 2.5 | 2.78 | 3.13 |
| 2.76 | 3.01 | 3.31 | 3.68 | 4.14 |
| 3.53 | 3.97 | 4.42 | 4.86 | 5.3 |
| 4.24 | 4.77 | 5.3 | 5.83 | 6.36 |
| 4 | 4.5 | 5 | 5.5 | 6 |
| 0.41 | 0.46 | 0.54 | 0.54 | 0.65 |
| 0.81 | 0.93 | 1.08 | 1.08 | 1.3 |
| 1.1 | 1.26 | 1.47 | 1.47 | 1.77 |
| 1.66 | 1.89 | 2.21 | 2.21 | 2.65 |
| 2.76 | 3.15 | 3.68 | 3.68 | 4.42 |
| 3.13 | 3.57 | 4.17 | 4.17 | 5 |
| 4.17 | 4.76 | 5.56 | 5.56 | 6.67 |
| 0.55 | 0.63 | 0.74 | 0.74 | 0.88 |
| 1.33 | 1.5 | 1.67 | 1.83 | 2 |
| 2 | 2.25 | 2.5 | 2.75 | 3 |
| 2.76 | 3.15 | 3.68 | 3.68 | 4.42 |

| SPS Model Number | Type | Voltage | PV Watts | Ah |
|---|---|---|---|---|
| SPS24-990/795M | MPPT | 24 | 990 | 795 |
| SPS24-1320/1060M | MPPT | 24 | 1320 | 1060 |
| SPS48-220/106M | MPPT | 48 | 220 | 106 |
| SPS48-330/170M | MPPT | 48 | 330 | 170 |
| SPS48-660/265M | MPPT | 48 | 660 | 265 |
| SPS48-990/400M | MPPT | 48 | 990 | 400 |
| SPS48-1320/530M | MPPT | 48 | 1320 | 530 |
| SPS48-1650/795M | MPPT | 48 | 1650 | 795 |
| SPS48-1980/1060M | MPPT | 48 | 1980 | 1060 |
| SPS Model Number | Type | Voltage | PV Watts | Ah |
| SPS12-55/52 | PWM | 12 | 55 | 52 |
| SPS12-110/106 | PWM | 12 | 110 | 106 |
| SPS12-165/158 | PWM | 12 | 165 | 158 |
| SPS12-240/212 | PWM | 12 | 240 | 212 |
| SPS12-320/318M | MPPT | 12 | 320 | 318 |
| SPS12-390/340M | MPPT | 12 | 390 | 340 |
| SPS12-480/424M | MPPT | 12 | 480 | 424 |
| SPS24-165/78 | PWM | 24 | 165 | 78 |
| SPS24-330/158 | PWM | 24 | 330 | 158 |
| SPS24-495/212 | PWM | 24 | 495 | 212 |
| SPS24-660/318M | MPPT | 24 | 660 | 318 |
| SPS24-990/400M | MPPT | 24 | 990 | 400 |
| SPS24-1320/600M | MPPT | 24 | 1320 | 600 |
| SPS48-220/52M | MPPT | 48 | 220 | 52 |
| SPS48-330/78M | MPPT | 48 | 330 | 78 |
| SPS48-660/170M | MPPT | 48 | 660 | 170 |
| SPS48-990/265M | MPPT | 48 | 990 | 265 |
| SPS48-1320/340M | MPPT | 48 | 1320 | 340 |
| SPS48-1650/400M | MPPT | 48 | 1650 | 400 |
| SPS48-1980/530M | MPPT | 48 | 1980 | 530 |

TO FIG. 10E

Days of Autonomy: Premium / Standard / Economy

| | | | | | |
|---|---|---|---|---|---|
| 1.05 | 1.55 | 2.04 | 2.48 | 3.31 | 3.68 |
| 1.41 | 2.06 | 2.72 | 3.31 | 4.42 | 4.91 |
| 0.13 | 0.19 | 0.26 | 0.32 | 0.39 | 0.45 |
| 0.19 | 0.29 | 0.39 | 0.48 | 0.58 | 0.67 |
| 0.35 | 0.52 | 0.68 | 0.83 | 1.1 | 1.23 |
| 0.53 | 0.78 | 1.03 | 1.25 | 1.67 | 1.85 |
| 0.7 | 1.03 | 1.36 | 1.66 | 2.21 | 2.45 |
| 0.96 | 1.45 | 1.93 | 2.41 | 2.89 | 3.37 |
| 1.16 | 1.73 | 2.31 | 2.89 | 3.47 | 4.05 |
| 1 | 1.5 | 2 | 2.5 | 3 | 3.5 |
| 0.12 | 0.18 | 0.24 | 0.31 | 0.37 | 0.43 |
| 0.24 | 0.37 | 0.49 | 0.61 | 0.73 | 0.86 |
| 0.36 | 0.53 | 0.71 | 0.89 | 1.07 | 1.24 |
| 0.53 | 0.77 | 1.01 | 1.33 | 1.6 | 1.77 |
| 0.82 | 1.16 | 1.51 | 1.99 | 2.47 | 2.65 |
| 0.9 | 1.24 | 1.62 | 2.13 | 2.83 | 2.83 |
| 1.12 | 1.55 | 2.02 | 2.65 | 3.53 | 3.53 |
| 0.18 | 0.28 | 0.37 | 0.46 | 0.55 | 0.64 |
| 0.37 | 0.55 | 0.73 | 0.92 | 1.1 | 1.28 |
| 0.55 | 0.77 | 1.01 | 1.33 | 1.65 | 1.77 |
| 0.84 | 1.16 | 1.51 | 1.99 | 2.54 | 2.65 |
| 1.06 | 1.46 | 1.9 | 2.5 | 3.33 | 3.33 |
| 1.59 | 2.19 | 2.86 | 3.75 | 5 | 5 |
| 0.14 | 0.19 | 0.25 | 0.33 | 0.42 | 0.43 |
| 0.21 | 0.28 | 0.37 | 0.49 | 0.64 | 0.65 |
| 0.42 | 0.62 | 0.81 | 1.06 | 1.27 | 1.42 |
| 0.64 | 0.95 | 1.26 | 1.59 | 1.91 | 2.21 |
| 0.85 | 1.24 | 1.62 | 2.12 | 2.54 | 2.83 |
| 1.06 | 1.46 | 1.9 | 2.5 | 3.18 | 3.33 |
| 1.27 | 1.91 | 2.52 | 3.18 | 3.82 | 4.42 |
| 1 | 1.5 | 2 | 2.5 | 3 | 3.5 |
| 32 | 24 | 20 | 18 | 15 | 14 |
| 22 | 15 | 13 | 12 | 10 | 9 |
| 11 | 8 | 7 | 6 | 5 | 5 |

| 4.14 | 4.73 | 5.52 | 5.52 | 6.63 |
|---|---|---|---|---|
| 5.52 | 6.31 | 7.36 | 7.36 | 8.83 |
| 0.51 | 0.58 | 0.64 | 0.71 | 0.77 |
| 0.77 | 0.87 | 0.96 | 1.06 | 1.16 |
| 1.38 | 1.58 | 1.84 | 1.84 | 2.21 |
| 2.08 | 2.38 | 2.78 | 2.78 | 3.33 |
| 2.76 | 3.15 | 3.68 | 3.68 | 4.42 |
| 3.85 | 4.34 | 4.82 | 5.3 | 5.78 |
| 4.63 | 5.2 | 5.78 | 6.36 | 6.94 |
| 4 | 4.5 | 5 | 5.5 | 6 |
| 0.43 | 0.54 | 0.54 | 0.67 | 0.72 |
| 0.88 | 1.1 | 1.1 | 1.34 | 1.47 |
| 1.3 | 1.6 | 1.63 | 1.96 | 2.13 |
| 1.77 | 2.21 | 2.21 | 2.93 | 2.94 |
| 2.65 | 3.31 | 3.31 | 4.42 | 4.42 |
| 2.83 | 3.54 | 3.54 | 4.72 | 4.72 |
| 3.53 | 4.42 | 4.42 | 5.89 | 5.89 |
| 0.65 | 0.81 | 0.81 | 1.01 | 1.08 |
| 1.32 | 1.65 | 1.65 | 2.02 | 2.19 |
| 1.77 | 2.21 | 2.21 | 2.94 | 2.94 |
| 2.65 | 3.31 | 3.31 | 4.42 | 4.42 |
| 3.33 | 4.17 | 4.17 | 5.56 | 5.56 |
| 5 | 6.25 | 6.25 | 8.33 | 8.33 |
| 0.43 | 0.54 | 0.54 | 0.72 | 0.72 |
| 0.65 | 0.81 | 0.81 | 1.08 | 1.08 |
| 1.42 | 1.77 | 1.77 | 2.33 | 2.36 |
| 2.21 | 2.76 | 2.76 | 3.5 | 3.68 |
| 2.83 | 3.54 | 3.54 | 4.66 | 4.72 |
| 3.33 | 4.17 | 4.17 | 5.56 | 5.56 |
| 4.42 | 5.52 | 5.52 | 7 | 7.36 |
| 4 | 4.5 | 5 | 5.5 | 6 |
| 12 | 11 | 10 | 9 | 8 |
| 8 | 7 | 6 | 6 | 5 |
| 5 | 4 | 4 | 3 | 3 |

SYSTEMS AND METHODS FOR SOLAR POWER EQUIPMENT

RELATED APPLICATIONS

This application, U.S. patent application Ser. No. 14/716,686 filed May 19, 2015, is a continuation of U.S. patent application Ser. No. 13/653,359, filed Oct. 16, 2012, now U.S. Pat. No. 9,037,443, issued May 19, 2015.

U.S. patent application Ser. No. 13/653,359 claims benefit of U.S. Provisional Patent Application Ser. No. 61/547,727, filed Oct. 16, 2011.

The contents of all applications listed above are incorporated herein by reference.

TECHNICAL FIELD

The present invention relates to systems and methods for designing solar power equipment and, more particularly, to computerized systems for designing solar power equipment customized for a particular use and location.

BACKGROUND

Solar power equipment must be specified to meet certain load requirements and to operate within given parameters in a particular location. The need exists to automate the process of specifying or designing solar power equipment.

SUMMARY

The present invention may be embodied as power equipment designed for use at a particular location comprises an insolation database, a load database, a processing system, and solar power equipment. The insolation database comprises insolation values associated with a plurality of geographic data points. The load database associates appropriate power equipment with load requirements. The processing system determines a solar power design from load requirements generated from the insolation database based on the insolation values associated with a geographic data point closest to the particular location and the load requirements selected from the load database. The solar power equipment is installed according to the solar power design.

The present invention may also be embodied as a method of operating power equipment at a particular location comprising the following steps. In a processing system, an insolation database comprising insolation values associated with a plurality of geographic data points is provided. In the processing system, a load database associating appropriate solar power equipment with load requirements is provided. Using the processing system, a geographic data point closest to the particular location is selected. Using the processing system, load requirements are generated from the insolation database based on the insolation values associated with the selected geographic data point. Using the processing system, a list of solar power equipment appropriate for the load requirements is generated from the load database. Using the processing system, a solar power design is generated based on the load requirements generated from the insolation database and the list of power equipment generated from the load database. The solar power equipment is installed at the particular location according to the solar power design.

The present invention may further be embodied as a power equipment designed for use at a particular location comprises a user interface, an insolation database, a load database, a processing system, and solar power equipment. The user interface allows entry of system specifications. The insolation database comprises insolation values associated with a plurality of geographic data points. The load database associates appropriate power equipment with load requirements. The processing system generates a plurality of solar power designs based on load requirements generated from the insolation database based on the system specifications, the insolation values associated with a geographic data point closest to the particular location, and the load database. The solar power equipment is installed according to the solar power design.

BRIEF DESCRIPTION OF THE DRAWINGS

FIG. 4A depicts a second data input panel displayed by the first example user interface in a first configuration;

FIG. 4B depicts the second data input panel in a second configuration;

FIG. 5 depicts a third data input panel displayed by the first example user interface;

FIGS. 9A and 9B are an example representation of a raw data table containing insolation data collected for Seattle, Wash. (47N, 123W); and FIGS. 10A, 10B, 10C, 10D, 10E, and 10F are an example of a Load Table containing load data calculated for a plurality of solar systems.

DETAILED DESCRIPTION

Figure 1:
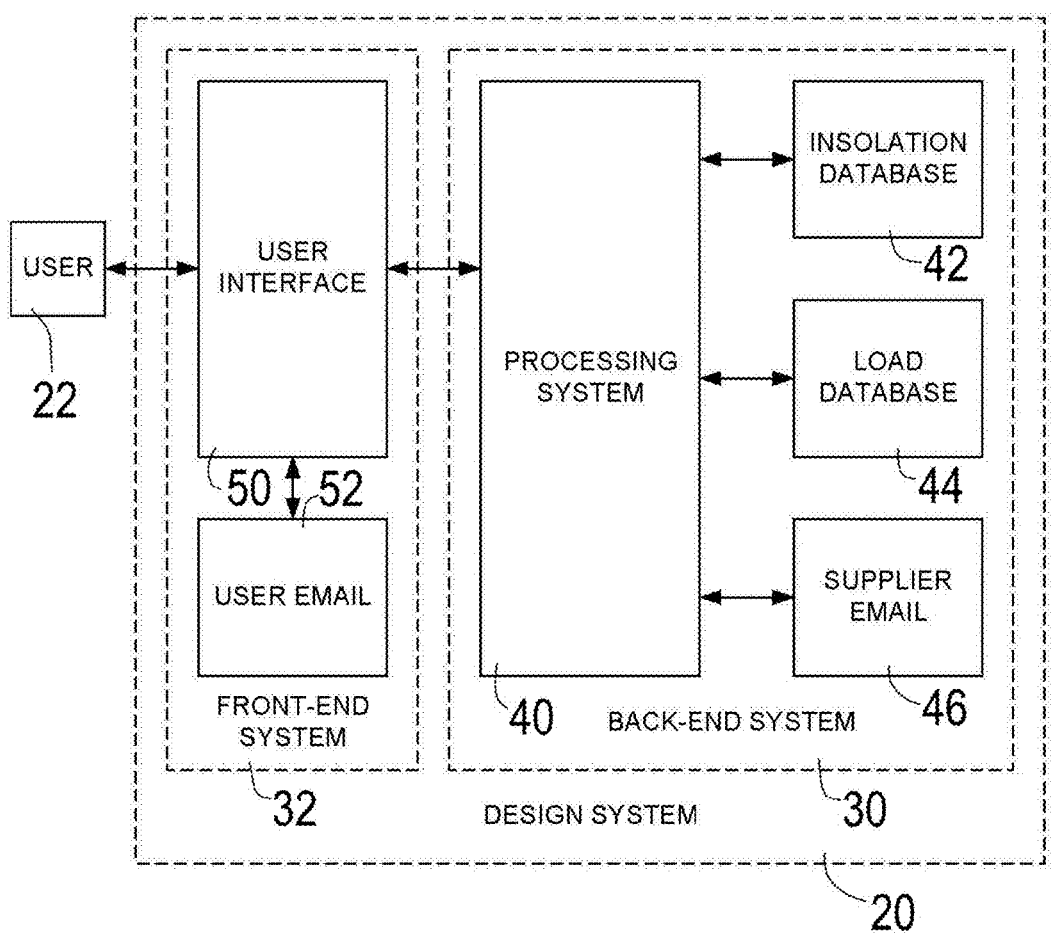
FIG. 1 is a block diagram of a first example design system for designing solar power equipment of the present invention.

Referring initially to FIG. 1 of the drawing, depicted therein is a first example design system 20 for allowing a user 22 to generate a solar power equipment design. The example design system 20 comprises a back-end system 30 and a front-end system 32. The example back-end system 30 comprises a processing system 40, an insolation database 42, a load database 44, and, optionally, a supplier email system 46. The example front-end system 32 is capable of generating a user interface 50 and optionally contains a user email system 52.

The back-end system 30 and the front-end system 32 may be implemented entirely on a single computer or may be distributed across a plurality of computers connected by a network (not shown). If used, the network may be a local area network or may be a distributed network such as the Internet. The network may be wired or wireless.

The back-end system 30 may be implemented as a database server application capable of storing data and performing calculations based on stored data and data collected by the front-end system 32. In this case, the front-end system 32 will be typically be implemented as a remote computer running a standalone software application capable of generating the user interface 50 and transmitting data to the back-end system 30. Alternatively, the back-end system 30 may be implemented as a web server capable of storing data, generating the user interface 50, and performing calculations based on stored data and data collected through the user interface 50. In this case, the front-end system 32 will typically be implemented as what is commonly referred to as a "thin client" or browser capable of running the user interface 50 as generated by the back-end system 30. And as generally discussed above, both the back-end system 20 and the front-end system 20 may be implemented as a software application running on a single computing device.

One or more parts of the first example design system 20 will typically include or be embodied as one or more applications running an operating system such as Microsoft Windows, Unix, and/or Apple OS X. Such operating systems typically run on a computing system such as a workstation, a server, a personal computer, and/or a laptop computer. Alternatively, one or more parts of the first example design system may include or be embodied as an application running on a personal digital assistant (PDA), tablet, or cell-phone-based computing device running an operating system such as Apple iOS or Google Android.

The insolation data stored in the insolation database 42 is or may be calculated from publicly available databases such as data published by the NASA Langly Research Center Atmospheric Science Data Center POWER Project (the NASA SSE database). The NASA SSE database contains raw insolation data for geographic data points corresponding to each 1° of latitude and longitude in the United States (including Alaska and Hawaii). The example insolation database 42 was generated by calculating for each data point in the NASA SSE database minimum and average insolation over a 22-year period. These minimum and average insolation values are stored for each data point in the example insolation database 42.

Figure 9A:
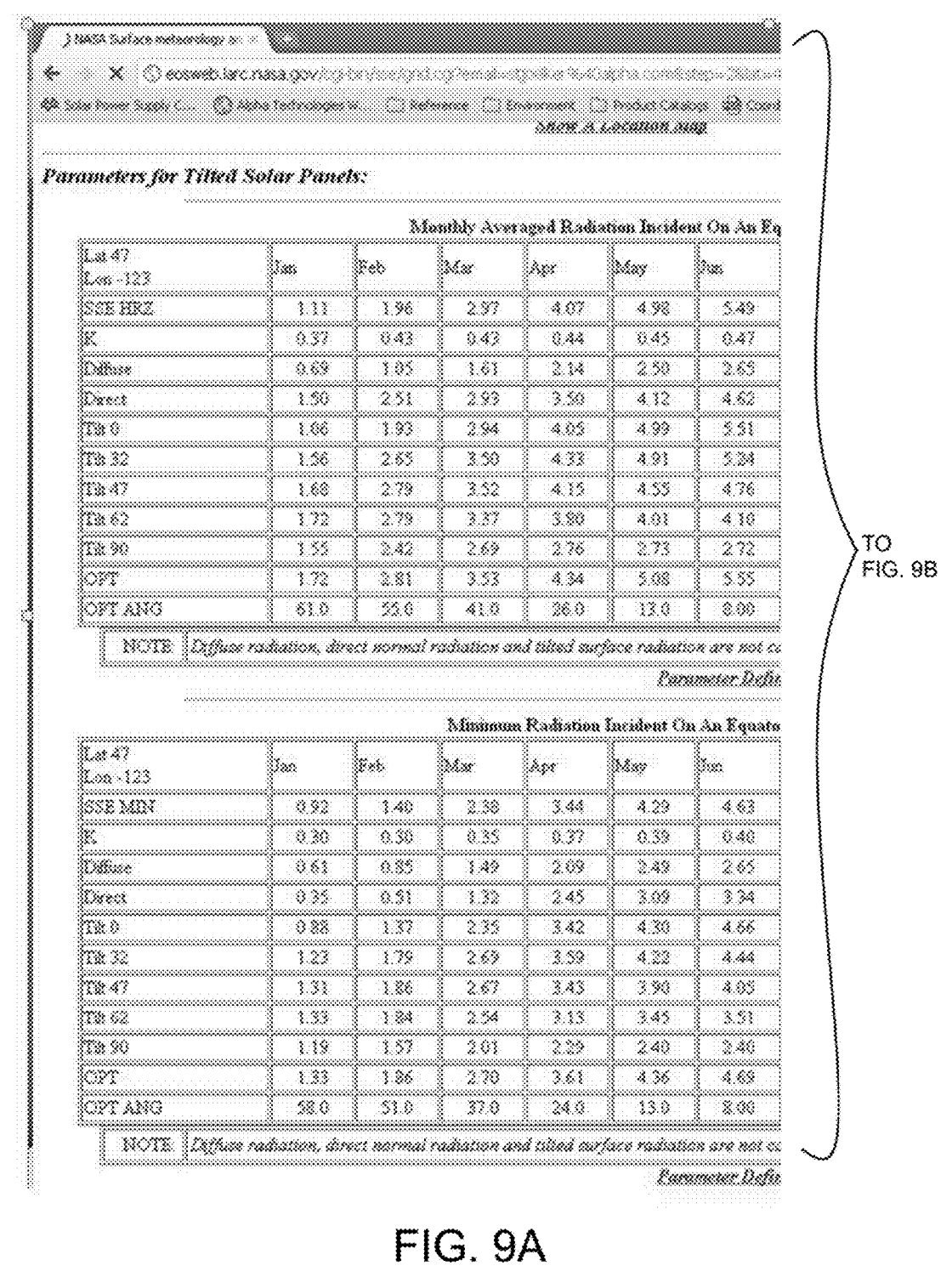
Figure 9B:
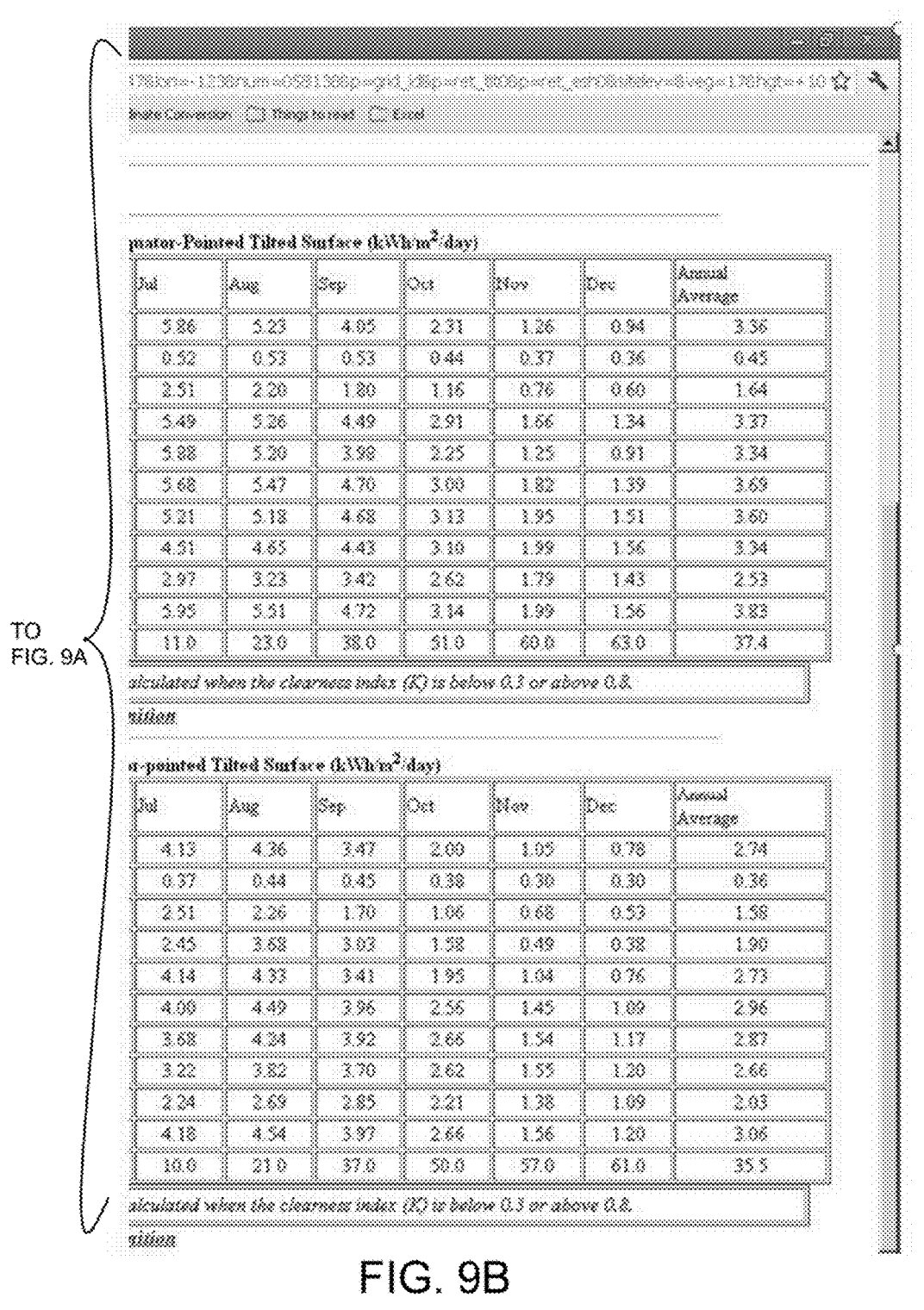

More specifically, the example insolation data stored in the insolation database was calculated as follows. First, data is obtained from the NASA LARC data online website by navigating to the page where the latitude and longitude of a particular geographical site can be entered. This will require entry of an email address and password or, if you are new to the website, you may be required to create a new account. The correct lat/long (taken from Google Maps in the User Input portion) is then entered, and the website displays a page with many categories and their corresponding list boxes. Find the category "Parameters for Tilted Solar Panels" and select both "Radiation on equator-pointed tilted surfaces" and Minimum radiation for equator-pointed tilted surfaces" from the list box on the right. To highlight multiple selections from a list box, press and hold Ctrl while clicking on each selection. Press "Submit" at the bottom of the page. The website now displays a page containing two tables. The insolation data is derived from one row from each table. In particular, the insolation data is derived from the row that corresponds to the tilt angle of the entered latitude plus 15°. For example, if you enter "48" for latitude, you are interested in the row identified as "Tilt 63". This row will always be the fourth from the bottom. An example of a representation of a raw data table containing insolation data collected for Seattle, Wash. (47N,123W) is shown in FIGS. 9A and 9B.

As will be described in further detail below, the average radiation value is used for Standard and Economy systems, while the minimum radiation value is used for Premium systems. The solar panel industry uses the term "insolation" to refer to substantially the same physical phenomena referred to in the tables as "radiation".

The example load database 44 contains data associated with a plurality of configurations of battery banks, photovoltaic (PV) panel array modules, and voltages. The load that a given battery bank could provide minus certain predetermined system losses was calculated. The load that a given PV panel array could support minus certain predetermined system losses was calculated for each solar resource. The smaller of these two load values corresponded to the minimum that a given system comprising a particular combination of battery bank and PV panel array could support. This process was repeated for each available voltage (e.g., 12V DC, 24V DC, 48V DC). The load data is calculated for a plurality of predetermined systems having different combinations of battery bank and PV panel array to provide an incremental increase in supportable loads.

An example of a Load Table containing load data calculated for a plurality of solar systems (e.g., combinations of battery banks and PV arrays) falling into Standard, Economy, and Premium categories is shown in FIGS. 10A-10F. Because of page size limitations, the example Load Table is broken into six sections, with the upper left section of the Load Table shown in FIG. 10A, the upper middle section of the Load Table shown in FIG. 10B, the upper right section of the Load Table shown in FIG. 10C, the lower left section of the Load Table shown in FIG. 10D, the lower middle section of the Load Table shown in FIG. 10E, and the lower right section of the Load Table shown in FIG. 10F.

Figure 2:
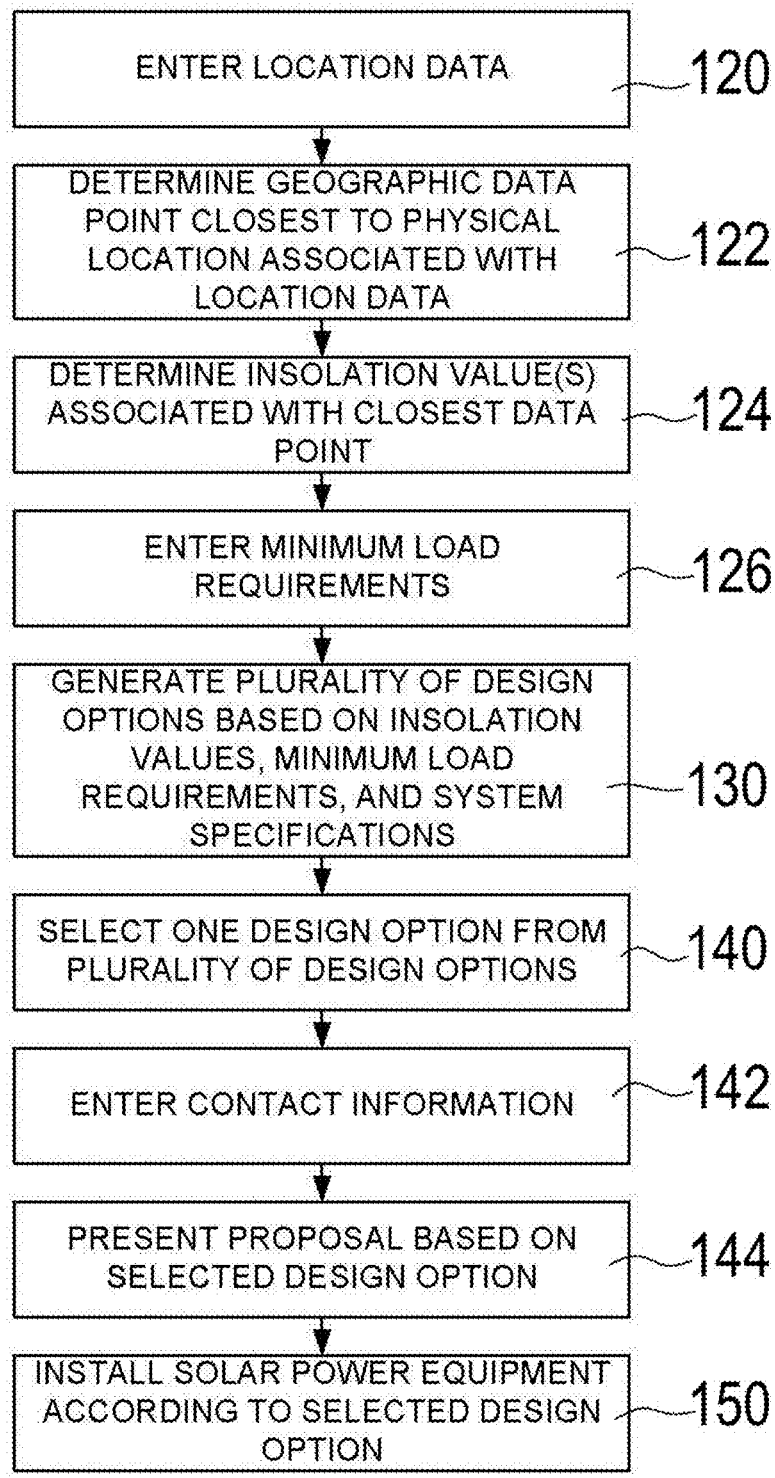
FIG. 2 is a flow chart depicting the logic flow of a first example design method that may be implemented by the first example design system.

Referring now to FIG. 2 of the drawing, one example method of using the first example design system 20 will now be described. Initially, using the user interface 50, the user enters location data at step 120. Based on the location data entered at step 120, the processing system 40 determines at step 122 the nearest geographic data point associated with the location data. At step 124, the processing system 40 determines from the insolation data stored in the insolation database 42 one or more insolation values associated with a physical location associated with the location data. As described above, the example processing system 40 will typically determine at least average insolation and minimum insolation for the physical location associated with the location data. The insolation value(s) associated with the location data are temporarily stored for later use as will be described in further detail below.

At step 126 in FIG. 2, the user enters minimum load requirements based on the specifications of the equipment to be powered by the solar power equipment to be located at the facility associated with the location data entered at step 120.

At step 130 in FIG. 2, the processing system 40 determines, based on the insolation value(s) associated with the location data as determined at step 124 and the minimum load requirements entered at step 126, a plurality of design options. In particular, using pre-calculated load tables, the processing system 40 selects the systems that will support the specified load, one system from each category in the table: Premium, Standard, and Economy. For each category, the processing selects the appropriate systems from each category by first finding the correct column (based on insolation) and then finding the correct row (based on system voltage and supportable load). Each row in the table represents one system. Each of the plurality of design options differs from the other in at least the "days of autonomy" associated with the design options. The term "days of autonomy" generally refers the length of time in days that a given system can be expected to operate, under a predetermined worst case scenario, at a particular facility given the load represented by the equipment at that facility and the average and/or minimum insolation level at the facility given the geographic location of the facility.

At step 140 in FIG. 2, the user selects one of the plurality of design options as a desired design. At step 142, the user enters the user's contact information. The supplier of the solar power equipment then generates a proposal based on the selected design option (i.e., the desired design) and presents the proposal to the user using the contact information at step 144. The optional email systems 46 and 52 may be used to communicate during the process of presenting and accepting the proposal. After the proposal has been accepted by the user, the solar power equipment is installed at step 150.

Figure 3:
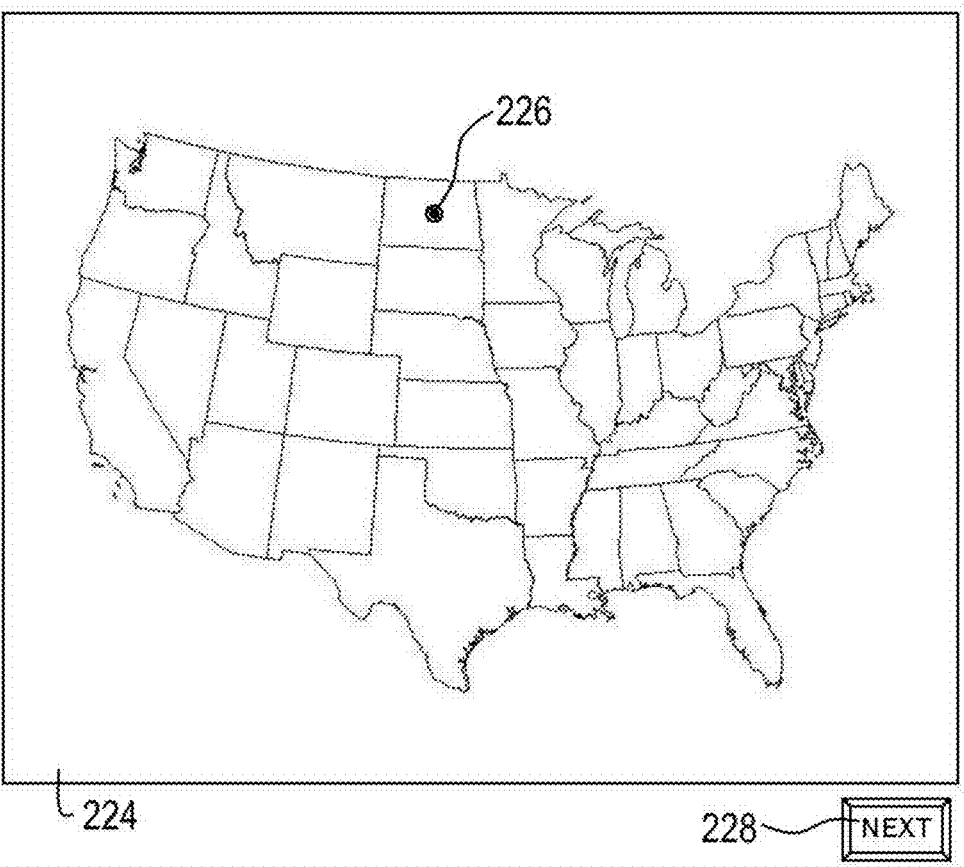
FIG. 3 depicts a first data input panel displayed by a first example user interface that may be generated by the first example design system.

Referring now to FIGS. 3-7 of the drawing, an example user interface that may be created by the example design system 20 will now be described. FIG. 3 depicts a location panel containing a LOCATION field 220, an optional PROJECT NAME field 222, and a map area 224. Optionally, the user first enters a project name (e.g., "Security System") into the PROJECT NAME field 222. The user next enters location data by typing the name of a city and state into the LOCATION field 220 or clicking on a location in the map area 224. As is conventional, the map area may be configured to zoom in and/or out to facilitate the identification of a specific location. A pin or other indicator 226 may be displayed in the map area 226 after the user has clicked on that location of the map area and/or entered a city and state. When the location data has been entered to the satisfaction of the user, the user presses a NEXT button 228.

Referring now to FIG. 4A of the drawing, depicted therein is a first configuration of a load panel containing a load description input field 230*a*, a load quantity input field 232*a*, a load Watts input field 234*a*, a load Hours/Day input field 236*a*, and a load Wh/Day input field 238*a*. The load panel further comprises a System Voltage dropdown selection box 240, and an ADD button 242. The example load panel further comprises a Total Daily Power Consumption display field 250, a Maximum Hourly Power Consumption display field 252, an Average Power Consumption display field 254, a System Load display field 256, and a NEXT button 258.

The user enters a description of each load in the Description field 230*a* (e.g., "Camera"), a quantity in the load Quantity field 232*a* (e.g., "2"), a power value in Watts in the load Watts field 234*a* (e.g., "10"), the number of hours in the day the load is expected to operate in the load Hours/Day field 236*a* (e.g., "24"), and a watt-hour per day value in the load Wh/Day field 238*a* (e.g., "480"). The user then identifies a voltage associated with the load by selecting one value (e.g., "12 V DC") from a plurality of voltages (e.g., "12 V DC", "24 V DC", and "48 V DC") in the System Voltage dropdown box 240. As depicted in FIGS. 3-7, the example interface only allows the creation of designs using only a single system voltage. In the future, however, the system may be designed to accommodate loads of different operating voltages, in which case each load will be associated with one of the plurality of voltages.

The display fields 250-256 indicate running totals generated for each of defined values based on the load values input in using the input fields 230-238. The user cannot alter or enter data in the display fields 250-256.

Commonly, a given project requires that multiple loads be powered. In this case, the user may click the ADD button 242, and a second configuration of the load panel is generated as depicted in FIG. 4B. The second configuration of the load panel further comprises a load description input field 230*b*, a load quantity input field 232*b*, a load Watts input field 234*b*, a load Hours/Day input field 236*b*, and a load Wh/Day input field 238*b* to allow the user to define a second load. By clicking the ADD button 242 after entering data associated with each load, the user is presented with multiple rows of entry fields like the fields 230*a*-238*a* and 230*b*-238*b*. The display fields 250-256 indicate running totals generated for each of defined values based on the load values input in using the input fields 230*a*-238*a* and 230*b*-238*b*, and any additional input fields displayed after clicking on the ADD button 242. After the user has entered all loads as described above, the user clicks on the NEXT button 258.

At this point, the user is presented with a select solution panel as depicted in FIG. 5. The select solution panel comprises a location overview area 260, a Premium solution area 262, a Standard solution area 264, an Economy solution area 266, and a NEXT button 268. The location overview area contains a nearest city display field 270, an average insolation display field 272 displaying an average insolation value associated with the nearest city, and a minimum insolation field 274 displaying a minimum insolation value associated with the nearest city.

The Premium, Standard, and Economy areas 262, 264, and 266 all contain the same information for each of three different solutions. Each of these areas 262, 264, and 266 contains a System display fields 280*a*, 280*b*, and 280*c*, a Days of Autonomy display field 282*a*, 282*b*, and 282*c*, a Voltage display field 284*a*, 284*b*, and 284*c*, a PV Array Size field 286*a*, 286*b*, and 286*c*, a Battery Bank Size display field 288*a*, 288*b*, and 288*c*, a PWM or MPPT display field 290*a*, 290*b*, and 290*c*, and a Warranty display field 292*a*, 292*b*, and 292*c*. The values and/or data displayed in these display fields is determined by the characteristics of the system defined in the System display fields and cannot be altered by the user. In the example depicted in FIG. 5, the user may, however, select anywhere in one of the three areas 262, 264, and/or 266 to select one of the three systems specified in these areas. Alternatively, the interface may be configured to allow the user to select and/or rank two or more of the systems defined in the areas 262, 264, and/or 266. After the user selects one of the area 262, 264, or 266 to identify a selected one of the design solutions, the user clicks on the NEXT button 268 to accept the system associated with the currently selected area 262, 264, or 266.

Figure 6:
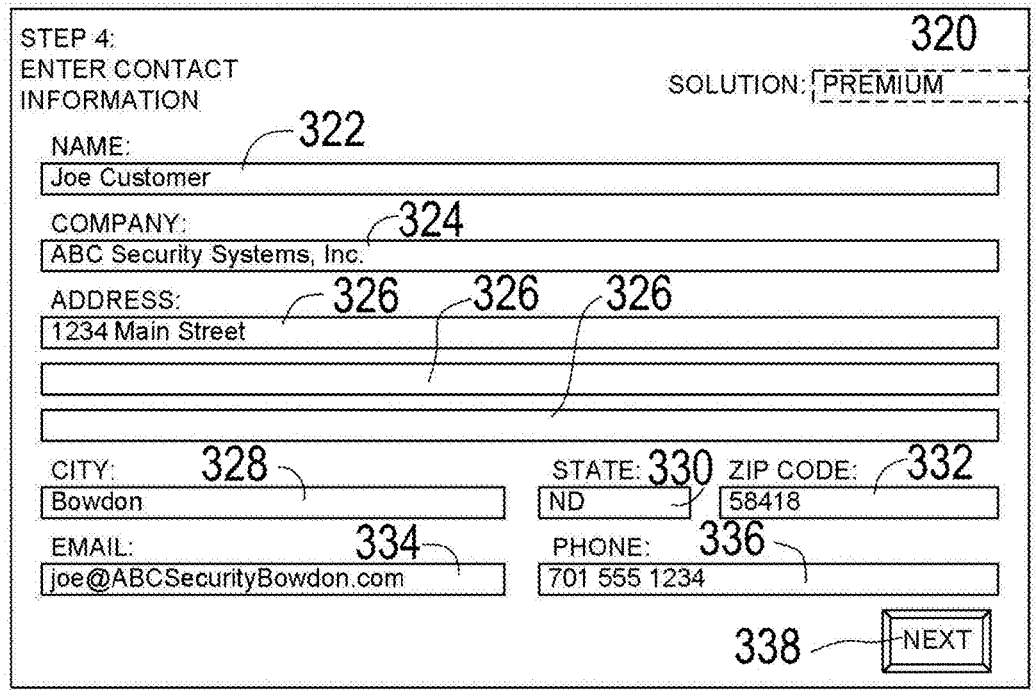
FIG. 6 depicts a fourth data input panel displayed by the first example user interface.

Referring now to FIG. 6 of the drawing, depicted therein is a contact information panel for allowing the user to enter contact information to establish contact with the supplier operating the design system 20. The example contact information panel comprises a SOLUTION display field 320 displaying the selected design solution, a NAME entry field 322, a COMPANY entry field 324, one or more ADDRESS entry fields 326, a CITY entry field 328, a STATE entry field 330, a ZIP CODE entry field 332, an EMAIL entry field 334, a PHONE entry field 336, and a NEXT button 338. The user enters the pertinent contact information in a conventional manner and then clicks on the NEXT button 338.

Figure 7:
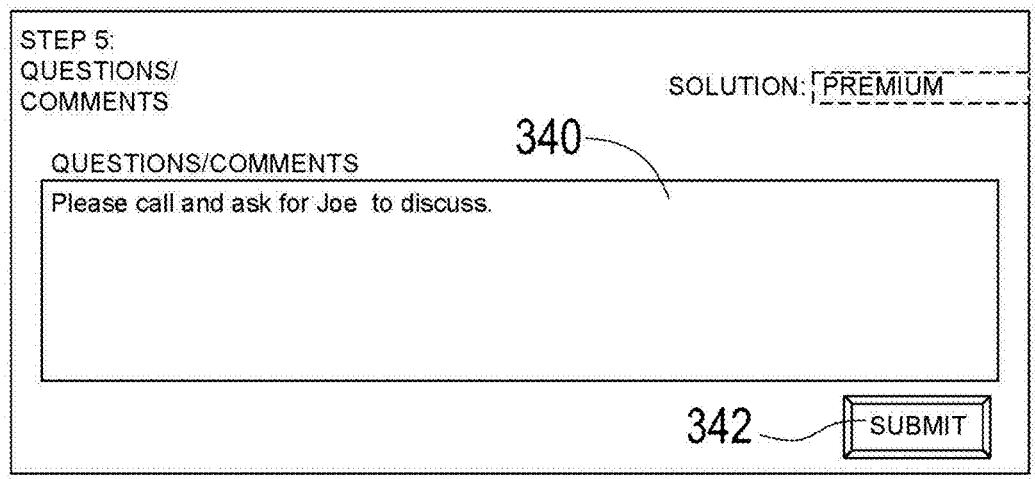
FIG. 7 depicts a fifth data input panel displayed by the first example user interface.

The interface then presents a questions/comments panel as depicted in FIG. 7. The questions/comments panels comprises a QUESTIONS/COMMENTS data entry field 340 to allow the user to type in specific requests and/or questions not handled in the predetermined data entry fields described above. After entering any relevant information in the QUESTIONS/COMMENTS data entry field 340, the user clicks a SUBMIT button 342 to submit the entered load data for generation of a proposal as generally discussed above.

Figure 8:
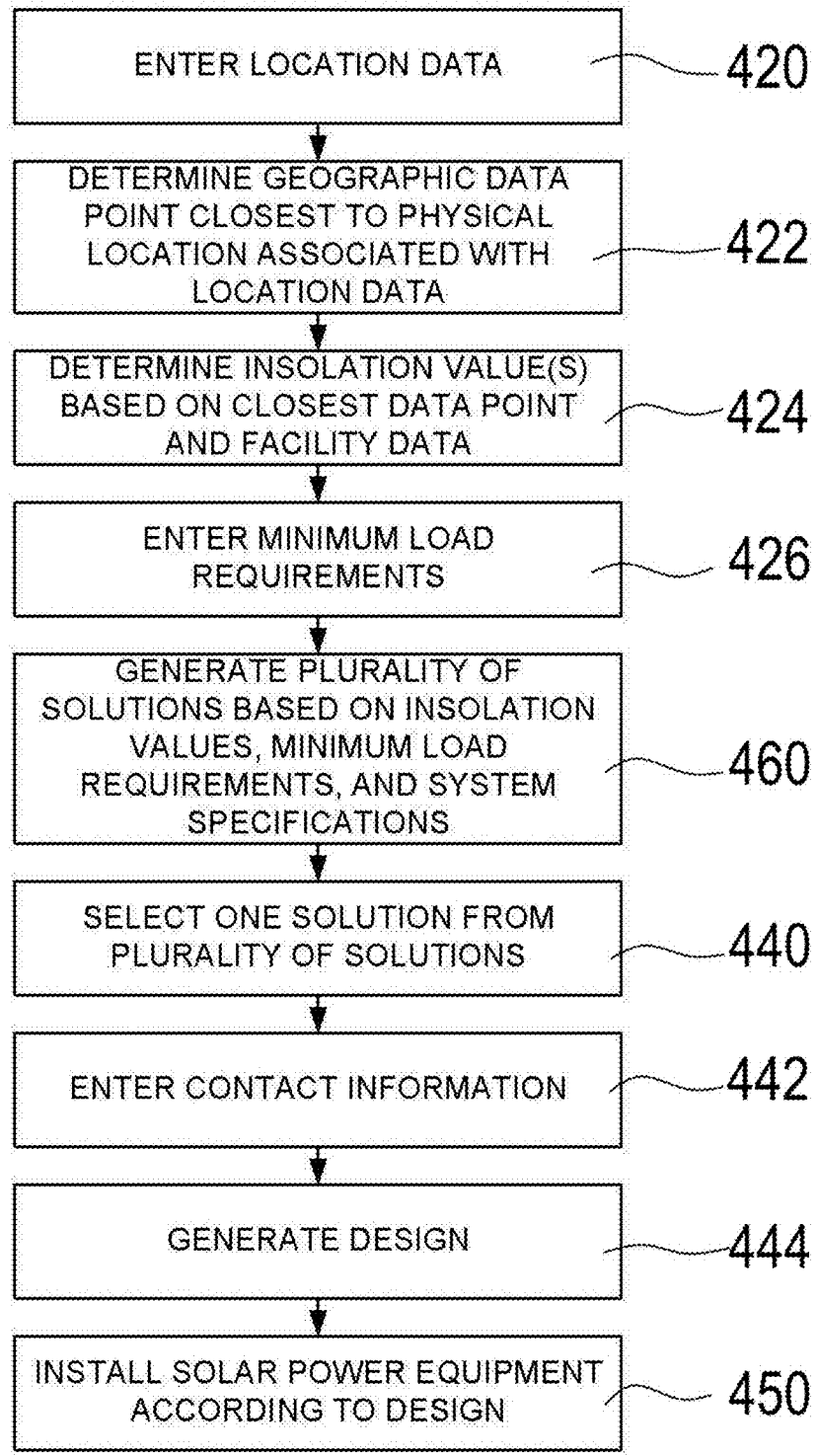
FIG. 8 is a flow chart depicting the logic flow of a second example design method that may be implemented by the first example design system.

Referring now to FIG. 8 of the drawing, a second example method of using the first example design system 20 will now be described. Modern computing devices commonly include additional facilities such as a camera and a global positioning system (GPS). It is also possible for such modern computing devices to contain hardware and software capable of determining a direction in which the device is pointed and/or angle of incidence of the device with respect to horizontal. Accordingly, the second example method depicted in FIG. 8 is configured to use additional facility data generated by such computing devices when calculating insolation value(s).

Like the first example method described above with respect to FIG. 2, the user of the second example method enters location data at step 420. This location data can be entered manually as described above with respect to FIG. 3 or, alternatively, by using a GPS system contained in the computing device. Additionally, the user can use a camera feature of the computing device, if available, to generate one or more images representing the view(s) of the sky from the possible location or locations where the solar PV array may be placed. The GPS system can further measure the direction and/or angle at which the solar PV array may be positioned to generate additional data about the possible locations or locations of the PV solar arrays. The image data, position, and angle data can be aggregated as facility data that can further be used to determine the efficacy of the PV solar array as installed at a particular facility.

Based on the location data entered at step 420, the processing system 40 determines at step 422 the nearest geographic data point associated with the location data. At step 424, the processing system 40 determines from the nearest geographic data point, the insolation data stored in the insolation database 42, and the facility data (e.g., image data, direction data, and/or angle data) one or more insolation values associated with a physical location associated with the location data. As described above, the example processing system 40 will typically determine at least average insolation and minimum insolation for the physical location associated with the location data. The insolation value(s) associated with the location data are temporarily stored for later use as will be described in further detail below.

At step 426 in FIG. 8, the user enters minimum load requirements based on the specifications of the equipment to be powered by the solar power equipment to be located at the facility associated with the location data entered at step 420.

At step 430 in FIG. 8, the processing system 40 determines, based on the insolation value(s) associated with the location data as determined at step 424 and the minimum load requirements entered at step 426, a plurality of design options. Each of the plurality of design options differs from the other in at least the "days of autonomy" associated with the design options. The term "days of autonomy" generally refers the length of time in days that a given system can be expected operate at a particular facility given the load represented by the equipment at that facility and the average and/or minimum insolation level at the facility given the geographic location of the facility.

At step 440 in FIG. 8, the user selects one of the plurality of design options as a desired design. At step 442, the user enters the user's contact information. The supplier of the solar power equipment then generates a proposal based on the selected design option (i.e., the desired design) and presents the proposal to the user using the contact information at step 444. The optional email systems 46 and 52 may be used to communicate during the process of presenting and accepting the proposal. After the proposal has been accepted by the user, the solar power equipment is installed at step 450.

A first example of the operation of a system incorporating the principles of the present invention can be illustrated by representing the differences among the Premium, Standard, and Economy solutions at one location for two different loads. The average and minimum insolation values for Phoenix, Ariz. are 5.08 Peak Sun-hours and 4.01 Peak Sun-hours, respectively. For a first load of 10 Watts operating at 12 Volts DC for 24 hours/day and a second load of 40 Watts operating at 12 Volts DC for 24 hours/day, the following Premium, Standard, and Economy solutions are obtained:

| | First Example Comparison Table | | | | | |
|---|---|---|---|---|---|---|
| | 10 Watts, 24 hours/day, 12 V DC | | | 40 Watts, 24 hours/day, 12 V DC | | |
| | Premium | Standard | Economy | Premium | Standard | Economy |
| Autonomy | 12 days | 6 days | 4 days | 12 days | 6 days | 4 days |
| Voltage | 12 V DC | 12 V DC | 12 V DC | 12 V DC | 12 V DC | 12 V DC |
| PV Size | 160 W | 110 W | 110 W | 480 W | 320 W | 320 W |
| Batt. Size | 318 Ah | 156 Ah | 106 Ah | 1060 Ah | 530 Ah | 318 Ah |
| Type | PWM | PWM | PWM | MPPT | MPPT | MPPT |
| Warranty | 5 year | 2 year | 1 year | 5 year | 2 year | 1 year |

A second example of the operation of a system incorporating the principles of the present invention can be illustrated by representing the differences among the Premium, Standard, and Economy solutions at two locations for the same load. The average and minimum insolation values for Phoenix, Ariz. are 5.08 Peak Sun-hours and 4.01 Peak Sun-hours, respectively, while the average and minimum insolation values for Bowdon, N. Dak. are 2.17 Peak Sun-hours and 1.73 Peak Sun-hours, respectively. For a load of 10 Watts operating at 12 Volts DC for 24 hours/day, the following Premium, Standard, and Economy solutions are obtained:

Second Example Comparison Table

|  | Phoenix, Arizona | | | Bowdon, North Dakota | | |
| --- | --- | --- | --- | --- | --- | --- |
|  | Premium | Standard | Economy | Premium | Standard | Economy |
| Autonomy | 12 days | 6 days | 4 days | 24 days | 13 days | 7 days |
| Voltage | 12 V DC | 12 V DC | 12 V DC | 12 V DC | 12 V DC | 12 V DC |
| PV Size | 160 W | 110 W | 110 W | 390 W | 320 W | 180 W |
| Batt. Size | 318 Ah | 156 Ah | 106 Ah | 800 Ah | 530 Ah | 158 Ah |
| Type | PWM | PWM | PWM | MPPT | MPPT | PWM |
| Warranty | 5 year | 2 year | 1 year | 5 year | 2 year | 1 year |

The present invention may be embodied as an automated design system tool for generating a power equipment proposal for a particular location, comprised of an insolation database with insolation values associated with a plurality of geographic data points, a load database associating appropriate power equipment with load requirements including duty cycles for the equipment, and a processing system which takes into account the periods of poor weather and corresponding low insolation to generate a power equipment proposal. The power equipment proposal will thus typically include three solutions based upon the required level of system reliability or up time as defined below.

The economy level design is for non-essential loads that can tolerate periodic outages based on seasonal weather changes which result in low levels of insolation.

The standard level design uses average insolation or weather patterns and is for loads that can tolerate occasional and/or rare outages based on extreme and unusual weather changes.

The premium level design uses worst case insolation or weather patterns over at least 20 years of data and is for critical loads that cannot tolerate any outages. The premium level design is thus designed for 24-7-365 operations.

The proposal is generated based on load requirements, the insolation database based on the insolation values associated with a geographic data point closest to the particular location, the periods of poor weather and corresponding low insolation, the level of system reliability required, and solar power equipment appropriate based on the load requirements generated from the insolation database.

The present invention may also be embodied as a design system for generating a power equipment proposal for a particular location comprising a user interface, an insolation database, a load database, and a processing system. The user interface allows entry of system specifications. The insolation database comprises insolation values associated with a plurality of geographic data points. The load database associates appropriate power equipment with load requirements. The processing system for generating a plurality of power equipment proposals based on load requirements generated from the insolation database based on the insolation values associated with a geographic data point closest to the particular location, and takes into account the periods of poor weather and corresponding low insolation and selects the solar power equipment from the load database based on the load requirements generated from the insolation database, and the system specifications.

What is claimed is:

1. Solar power equipment designed for use at a particular location, comprising:
an insolation database comprising at least first and second insolation values associated with each of a plurality of geographic data points;
a load database associating predetermined solar power systems with load data; and
a processing system for
allowing the user to enter minimum load requirements for power equipment at the particular location,
determining a first solar power design based on
the minimum load requirements for power equipment at the particular location,
the first insolation value in the insolation database associated with a geographic data point closest to the particular location, and
load data in the load database,
determining a second solar power design based on
the minimum load requirements for power equipment at the particular location,
the second insolation value in the insolation database associated with the geographic data point closest to the particular location, and
load data in the load database; whereby
the solar power equipment is installed according to one of the first and second solar power designs.

2. Solar power equipment as recited in claim 1, in which the processing system further generates a third solar power design.

3. Solar power equipment as recited in claim 1, further comprising a user interface for allowing one of the first and second solar power designs to be selected.

4. Solar power equipment as recited in claim 1, further comprising a user interface, wherein
the user interface allows entry of the minimum load requirements for power equipment at the particular location.

5. Solar power equipment as recited in claim 1, in which:
the first value is an average insolation value; and
the second value is a minimum insolation value.

6. Solar power equipment as recited in claim 5, in which a first cost associated with the first solar power design is less than a second cost associated with the second solar power design.

7. A method of operating solar power equipment at a particular location, comprising:
providing, in a processing system, an insolation database comprising at least first and second insolation values associated with each of a plurality of geographic data points;
providing, in the processing system, a load database associating predetermined power systems with load data;
selecting, using the processing system, a geographic data point closest to the particular location;
entering, using the processing system, minimum load requirements for power equipment at the particular location;

determining, using the processing system, a first solar power design based on the minimum load requirements for power equipment at the particular location, the first insolation value in the insolation database associated with the geographic data point closest to the particular location, and load data in the load database;

determining, using the processing system, a second solar power design based on the minimum load requirements for power equipment at the particular location, the second insolation value in the insolation database associated with the geographic data point closest to the particular location, and load data in the load database; and installing the solar power equipment at the particular location according to one of the first and second solar power designs.

8. A method as recited in claim 7, in which a third solar power design is generated.

9. A method as recited in claim 7, further comprising the steps of:
providing a user interface; and
selecting one of the first and second solar power designs using the user interface.

10. A method as recited in claim 7, further comprising the steps of:
providing a user interface;
entering the minimum load requirements for power equipment at the particular location using the user interface.

11. A method as recited in claim 7, in which:
the first value is an average insolation value; and
the second value is a minimum insolation value.

12. A method as recited in claim 11, in which a first cost associated with the first solar power design is less than a second cost associated with the second solar power design.

13. Solar power equipment designed for use at a particular location, comprising:
a user interface that allows entry of minimum load requirements for power equipment at the particular location;
an insolation database comprising at least average and minimum insolation values associated with each of a plurality of geographic data points;
a load database associating predetermined solar power systems with load data; and
a processing system for
generating a first solar power design based on the minimum load requirements for power equipment at the particular location, the average insolation value associated with a geographic data point closest to the particular location, and load data in the load database, and
generating a second solar power design based on the minimum load requirements for power equipment at the particular location, the minimum insolation value associated with a geographic data point closest to the particular location, and load data in the load database; and
the solar power equipment is installed according to at least one of the first and second solar power designs.

14. Solar power equipment as recited in claim 13, in which the user interface further allows one of the first and second solar power designs to be selected.

15. Solar power equipment as recited in claim 13, in which a first cost associated with the first solar power design is less than a second cost associated with the second solar power design.

* * * * *